US009673193B2

(12) United States Patent
Zhang et al.

(10) Patent No.: US 9,673,193 B2
(45) Date of Patent: Jun. 6, 2017

(54) MANUFACTURING METHOD FOR REVERSE CONDUCTING INSULATED GATE BIPOLAR TRANSISTOR

(71) Applicant: CSMC TECHNOLOGIES FAB1 CO., LTD., Wuxi New District (CN)

(72) Inventors: Shuo Zhang, Wuxi New District (CN); Qiang Rui, Wuxi New District (CN); Genyi Wang, Wuxi New District (CN); Xiaoshe Deng, Wuxi New District (CN)

(73) Assignee: CSMC TECHNOLOGIES FAB1 CO., LTD., Wuxi New District (CN)

( * ) Notice: Subject to any disclaimer, the term of this patent is extended or adjusted under 35 U.S.C. 154(b) by 0 days.

(21) Appl. No.: 14/902,519

(22) PCT Filed: Aug. 19, 2014

(86) PCT No.: PCT/CN2014/084720
§ 371 (c)(1),
(2) Date: Dec. 31, 2015

(87) PCT Pub. No.: WO2015/024502
PCT Pub. Date: Feb. 26, 2015

(65) Prior Publication Data
US 2016/0379974 A1 Dec. 29, 2016

(30) Foreign Application Priority Data
Aug. 23, 2013 (CN) .......................... 2013 1 0374240

(51) Int. Cl.
*H01L 27/06* (2006.01)
*H01L 29/66* (2006.01)
(Continued)

(52) U.S. Cl.
CPC .... *H01L 27/0664* (2013.01); *H01L 21/26513* (2013.01); *H01L 21/304* (2013.01);
(Continued)

(58) Field of Classification Search
CPC ........... H01L 27/0664; H01L 21/26513; H01L 21/304; H01L 21/3065; H01L 29/0638;
(Continued)

(56) References Cited

U.S. PATENT DOCUMENTS 6,482,681 B1 11/2002 Francis et al.
7,557,386 B2 7/2009 Ruething et al.
(Continued)

FOREIGN PATENT DOCUMENTS

CN 1439172 A 8/2003
CN 1691349 11/2005
(Continued)

OTHER PUBLICATIONS

English Translation of PCT Search Report for International Application No. PCT/CN2014/084720; mailed on Nov. 19, 2014.
(Continued)

*Primary Examiner* — Karen Kusumakar
(74) *Attorney, Agent, or Firm* — Kagan Binder, PLLC

(57) ABSTRACT

A manufacturing method for reverse conducting insulated gate bipolar transistor, the manufacturing method is characterized by the use of polysilicon for filling in grooves on the back of a reverse conducting insulated gate bipolar transistor. The parameters of reverse conducting diodes on the back of the reverse conducting insulated gate bipolar transistor can be controlled simply by controlling the doping concentration of the polysilicon accurately, indicating relatively low requirements for process control. The reverse conducting insulated gate bipolar transistor manufacturing method is relatively low in requirements for process control and relatively small in manufacturing difficulty.

10 Claims, 8 Drawing Sheets

(51) Int. Cl.
  *H01L 29/739* (2006.01)
  *H01L 21/3065* (2006.01)
  *H01L 21/265* (2006.01)
  *H01L 21/304* (2006.01)
  *H01L 29/10* (2006.01)
  *H01L 29/06* (2006.01)

(52) U.S. Cl.
  CPC ...... *H01L 21/3065* (2013.01); *H01L 29/0638* (2013.01); *H01L 29/1095* (2013.01); *H01L 29/66333* (2013.01); *H01L 29/7395* (2013.01)

(58) Field of Classification Search
  CPC ........... H01L 29/1095; H01L 29/66333; H01L 29/7395
  See application file for complete search history.

(56) References Cited

U.S. PATENT DOCUMENTS

| | | | |
|---|---|---|---|
| 8,039,322 | B2 | 10/2011 | Iwabuchi et al. |
| 8,299,495 | B2 | 10/2012 | Inagawa |
| 2005/0017290 | A1* | 1/2005 | Takahashi ........... H01L 29/0696 257/328 |
| 2008/0135870 | A1 | 6/2008 | Okada et al. |
| 2009/0184338 | A1 | 7/2009 | Hisamoto |
| 2009/0315071 | A1 | 12/2009 | Iwabuchi et al. |
| 2013/0234201 | A1* | 9/2013 | Xiao ................... H01L 29/7393 257/139 |

FOREIGN PATENT DOCUMENTS

| | | |
|---|---|---|
| CN | 101060133 A | 10/2007 |
| CN | 101494238 A | 7/2009 |
| CN | 102741982 | 10/2012 |
| CN | 102916042 | 2/2013 |
| CN | 103035691 A | 4/2013 |
| CN | 103125023 | 5/2013 |
| CN | 103137472 A | 6/2013 |
| EP | 0430237 A1 | 6/1991 |
| WO | 2015/010606 | 1/2015 |
| WO | 2015/014263 | 2/2015 |
| WO | 2015/027961 | 3/2015 |
| WO | 2015/081866 | 6/2015 |
| WO | 2015/103910 | 7/2015 |

OTHER PUBLICATIONS

Deng et al., U.S. Appl. No. 14/902,516, International Application Filing Date Jul. 29, 2014.
Zhong et al., U.S. Appl. No. 14/902,517, International Application Filing Date Jul. 22, 2014.
Wang et al., U.S. Appl. No. 14/902,302, International Application Filing Date Sep. 2, 2014.
Zhang et al., U.S. Appl. No. 15/023,049, International Application Filing Date Dec. 3, 2014.
Jing, U.S. Appl. No. 15/023,057, International Application Filing Date Dec. 4, 2014.
Office Action from counterpart Chinese Patent Application No. 201310374240.3 and English Translation thereof, dated Oct. 27, 2016 and related Search Report (12 pages).
Extended European Search Report from counterpart European Patent Application No. 14838639.4, dated Dec. 22, 2016 (9 pages).

* cited by examiner

MANUFACTURING METHOD FOR REVERSE CONDUCTING INSULATED GATE BIPOLAR TRANSISTOR

FIELD OF THE INVENTION

The present invention relates to a method of manufacturing a semiconductor device, and particularly relates to a method of manufacturing the reverse conducting insulated gate bipolar transistor.

BACKGROUND OF THE INVENTION

The insulated gate bipolar transistor (IGBT) generally is a common power switching device controlled by a voltage. It has the features of a large input capacitance, a high input resistance, high voltage resistance, a high work temperature, a simple control circuit and the like, and becomes a main device of the power electronics apparatus at the present stage. The reverse conducting insulated gate bipolar transistor is a new IGBT device, and it integrates an IGBT structure and a reverse conducting diode structure on a same chip, which can improve the passage of non-balanced carriers and optimizing the tail current. The reverse conducting IGBT device has many advantages of a small size, a high power density, a low cost, a high reliability and the like.

The method of manufacturing the reverse conducting diode structure at the back side of the device in the method of manufacturing the common reverse conducting IGBT has two main manners. A method of manufacturing the reverse conducting diode structure of the reverse conducting IGBT is implemented by using two back side photoetching processes. Particularly, a P+ type area is formed by firstly performing selective implantation and diffusion processes, and then an N+ type area is formed by performing selective implantation and diffusion processes again. As a result, the N+ and P+ areas can be formed at intervals on the back side of the reverse conducting IGBT. The interval N+ and P+ areas are the reverse conducting diode structure. The back side N+ area of the reverse conducting IGBT formed by using this manufacturing method is shallower, and has a higher requirement for controlling the process. Once the doping concentration of the N+ area becomes higher, when the formed reverse conducting IGBT is forward conducted, a large implantation effect can be formed, resulting in losing the function of the reverse conducting IGBT.

Another method of manufacturing the reverse conducting diode structure of the reverse conducting IGBT is described as follows. After the front side process is performed and the back side P+ layer is formed, digging of the trench is performed, and then the reverse conducting diode structure of the reverse conducting IGBT is finally formed by filling back side metal in the trench. The method of manufacturing the reverse conducting diode structure of the reverse conducting IGBT mainly use the means of digging of the trench and filling of the back side metal to form he reverse conducting diode structure. However, because the metal in the trench at the back side of the reverse conducting IGBT is limited by requirement of collector metal of the reverse conducting IGBT, the parameters of the reverse conducting diode can be adjusted only by adjusting the width and depth of the dug trench, resulting in troubling of the adjusting process and a high requirement of controlling the process. Therefore, from the above process methods, it can be understood that the common method of manufacturing the reverse conducting diode structure at the back side of the reverse conducting IGBT device has a higher requirement of controlling the manufacturing process, and a larger difficulty of manufacturing.

SUMMARY OF THE INVENTION

On the basis of this, it is necessary to provide a method of manufacturing a reverse conducting insulated gate bipolar transistor, which can reduce the requirement of controlling the process, and reduce the difficulty of manufacturing.

A method of manufacturing a reverse conducting insulated gate bipolar transistor includes: preparing an N-type substrate; growing a gate oxide layer at a front side of the N-type substrate; depositing a polysilicon gate on the gate oxide layer; forming a P well on the N-type substrate by photoetching, etching and ion-implanting processes; forming an N+ region and a front side P+ region in the P well by photoetching and ion-implanting processes; depositing a dielectric layer at the front side of the N-type substrate; depositing a protecting layer on the dielectric layer; grinding the N-type substrate by a back side grinding process; forming a back side P+ region by implanting a P-type impurity to a back side of the N-type substrate; forming a trench at the back side of the N-type substrate by photoetching and etching processes; filling the trench by depositing polysilicon at the back side of the N-type substrate, and etching polysilicon at an area outside of the trench; removing the protecting layer at the front side of the N-type substrate; selectively etching the dielectric layer, and forming a front side metal layer to form a contact hole for shorting the N+ region and the front side P+ region; depositing a passivation layer at the front side of the N-type substrate; and performing a back side metalized process at the back side of the N-type substrate and forming a back side metal layer.

In one of embodiments, after forming the back side metal layer by performing the back side metalized process at the back side of the N-type substrate, the method further comprises controlling a carrier lifetime at a partial area in the N-type substrate by a local radiation technique.

In one of embodiments, the local radiation technique radiates the N-type substrate by using electron or proton.

In one of embodiments, the trench formed at the back side of the N-type substrate is of a rectangle shape.

In one of embodiments, a depth of the trench formed at the back side of the N-type substrate is from 1 to 20 µm, a width thereof is from 1 to 30 µm, and a distance between two adjacent trenches is 50 to 300 µm.

In one of embodiments, the polysilicon deposited in the trench formed at the back side of the N-type substrate is N-type polysilicon.

In one of embodiments, a doping concentration of the polysilicon deposited in the trench formed at the back side of the N-type substrate is from 1E17 to 1E21 $cm^{-3}$.

In one of embodiments, from the N-type substrate to an external, the back side metal layer comprises aluminum, titanium, nickel and silver, which are laminated in that order.

In one of embodiments, the dielectric layer is made of silicon dioxide and boro-phospho-silicate glass.

In one of embodiments, the protecting layer is made of silicon nitride.

The method of manufacturing the reverse conducting insulated gate bipolar transistor described above uses polysilicon to fill the trench at the back side of the reverse conducting insulated gate bipolar transistor. The parameters of the reverse conducting diode at the back side of the reverse conducting insulated gate bipolar transistor can be controlled by only precisely controlling the doping concentration of polysilicon, resulting in a lower requirement of controlling the process. The method of manufacturing the reverse conducting insulated gate bipolar transistor has a lower requirement of controlling the manufacturing process, and a less difficulty of manufacturing.

DETAILED DESCRIPTION OF THE EMBODIMENTS

Figure 1:
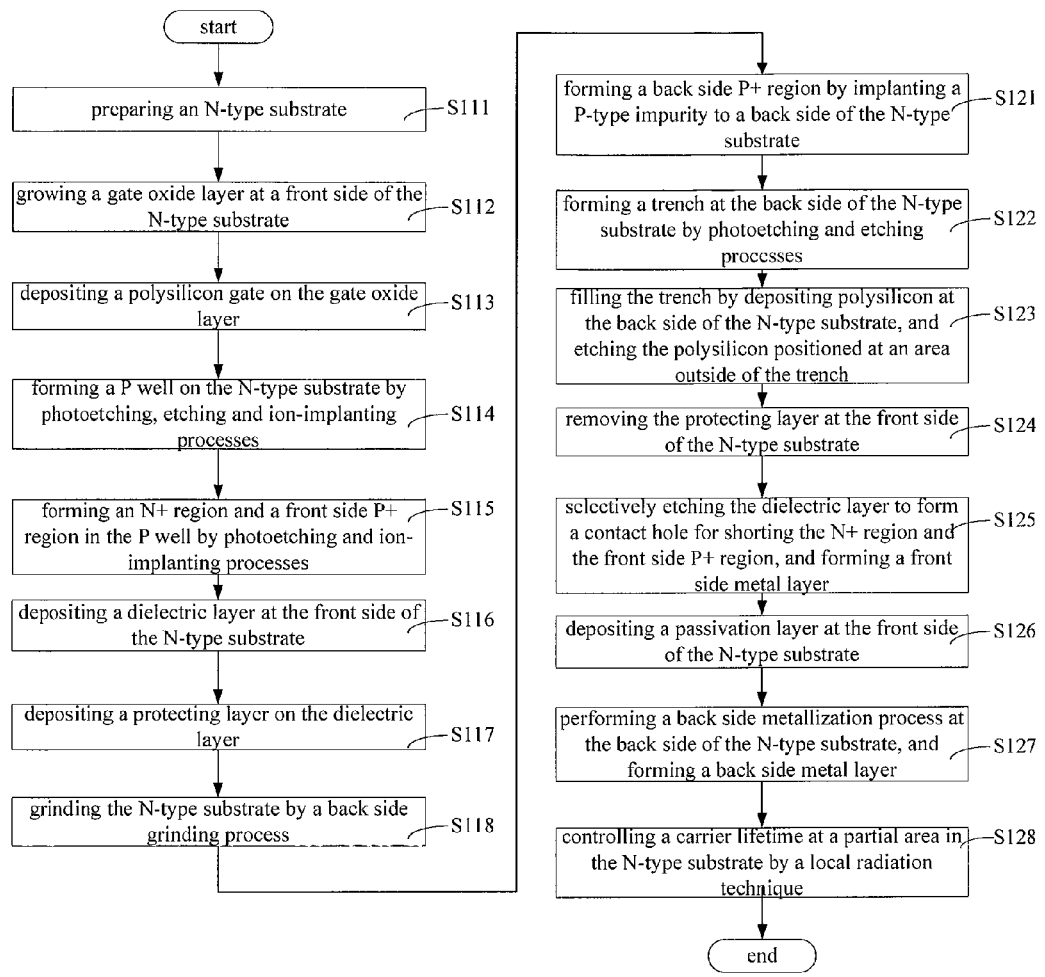
FIG. 1 shows a flow chart of a method of manufacturing the reverse conducting insulated gate bipolar transistor in an embodiment.

Referring to FIG. 1, in an embodiment, the method of manufacturing the reverse conducting insulated gate bipolar transistor is provided, which includes the following steps.

Figure 2:
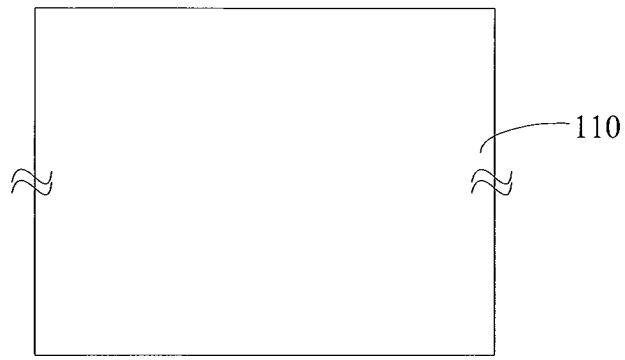
FIGS. 2 to 17 are schematic diagrams of corresponding reverse conducting insulated gate bipolar transistor in the manufacturing method of the field stop insulated gate bipolar transistor shown in FIG. 1.

In step S111, an N-type substrate 110 is prepared. As shown in FIG. 2, the N-type substrate 110 is an N-type silicon substrate.

Figure 3:
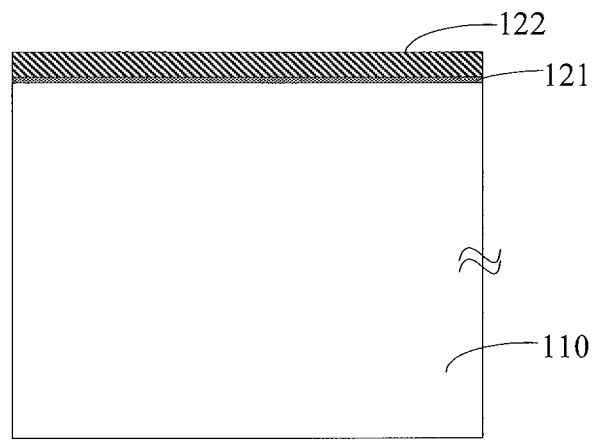

In step S112, a gate oxide layer 121 is grown at a front side of the N-type substrate 110. As shown in FIG. 3, the thickness of the gate oxide layer 121 is from 600 angstroms to 1500 angstroms.

In step S113, a polysilicon gate 122 is deposited on the gate oxide layer 121, as shown in FIG. 3.

Figure 4:
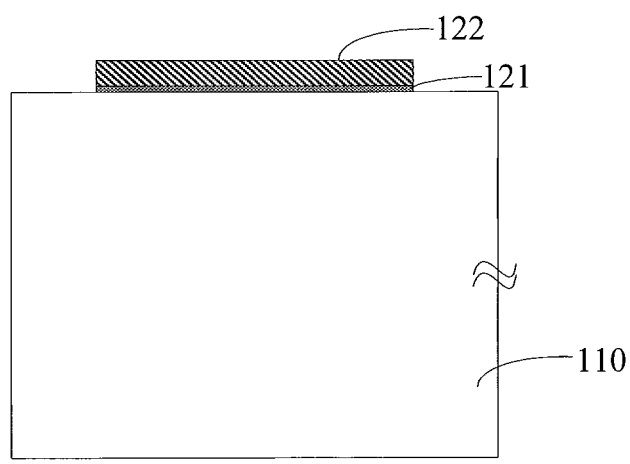
Figure 5:
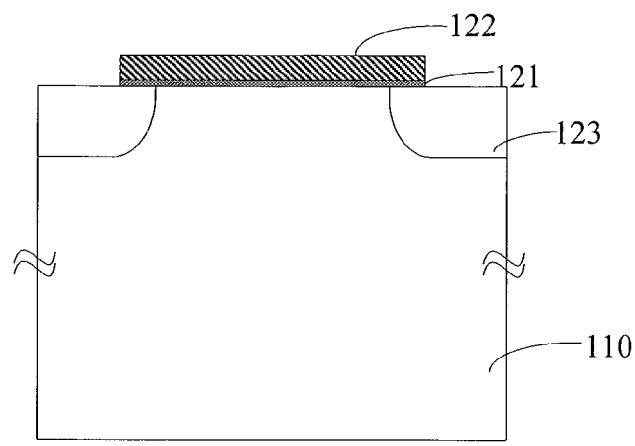

In step S114, a P well 123 is formed on the N-type substrate 110 by photoetching, etching and ion-implanting processes (referring to FIG. 5). Referring to FIG. 4, an implantation window of the P well 123 is formed by selectively etching the polysilicon gate 122 and the gate oxide layer 121 by the photoetching process. Referring to FIG. 5, a P-type impurity is implanted to the implantation window of the P well 123 by the self-aligned implantation process, and the P well 123 is formed by a drive-in process.

Figure 6:
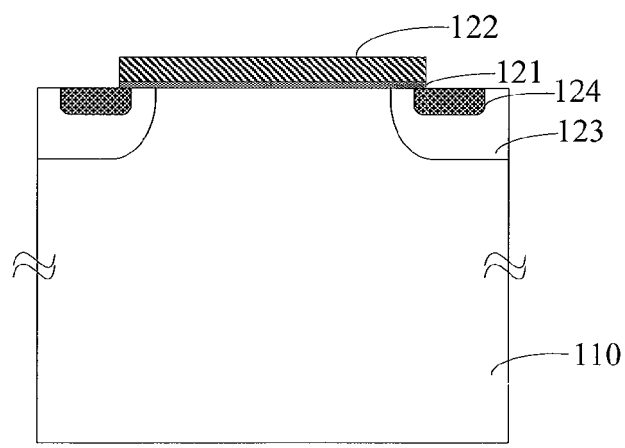
Figure 7:
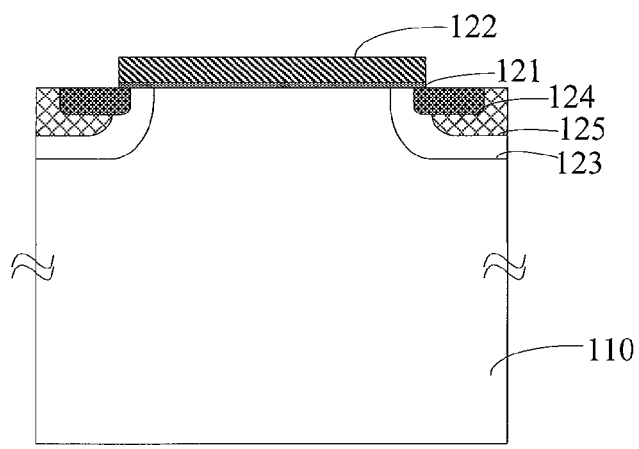

In step S115, an N+ region 124 and a front side P+ region 125 are formed in the P well 123 by photoetching and ion-implanting processes (referring to FIG. 7). Referring to FIG. 6, ions are selectively implanted to the P well 123 by the photoetching process, and the N+ region 124 is formed by the drive-in process. Referring to FIG. 7, ions are selectively implanted to the P well 123 by the photoetching process, and the front side P+ region 125 is formed by the drive-in process. The N+ region 124 is mainly configured as an emitter of the reverse conducting insulated gate bipolar transistor.

Figure 8:
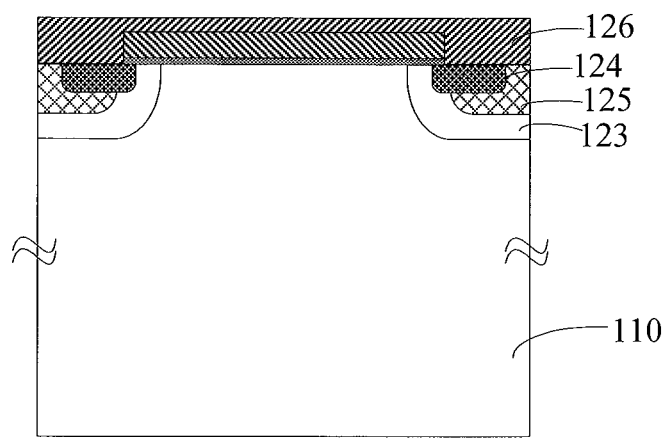

In step S116, a dielectric layer 126 is deposited at the front side of the N-type substrate 110. As shown in FIG. 8, the dielectric layer 126 is made of silicon dioxide and borophospho-silicate glass.

Figure 9:
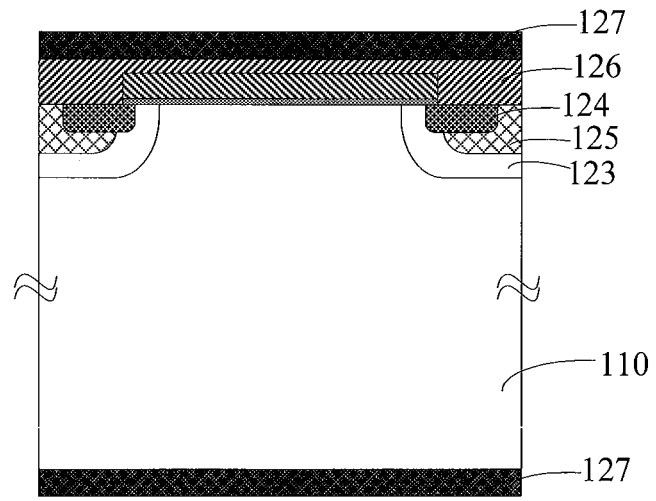

In step S117, a protecting layer 127 is deposited on the dielectric layer 126. As shown in FIG. 9, the protecting layer is made of silicon nitride.

In step S118, the N-type substrate 110 is ground by a back side grinding process. In step 118, the N-type substrate 110 is ground to the required thickness.

Figure 10:
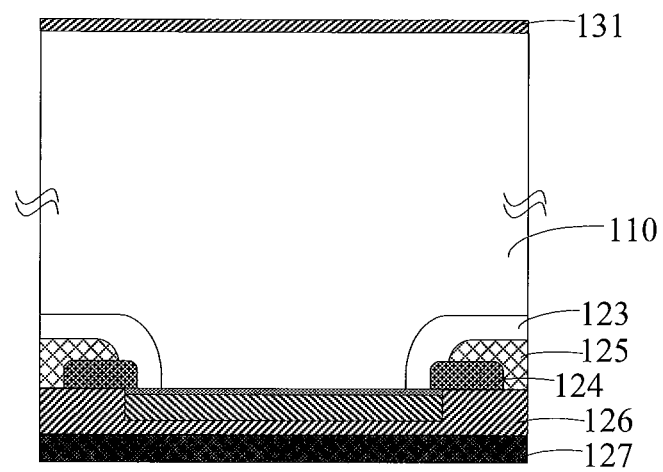

In step S121, a back side P+ region 131 is formed by implanting a P-type impurity to a back side of the N-type substrate 110, as shown in FIG. 10.

Figure 11:
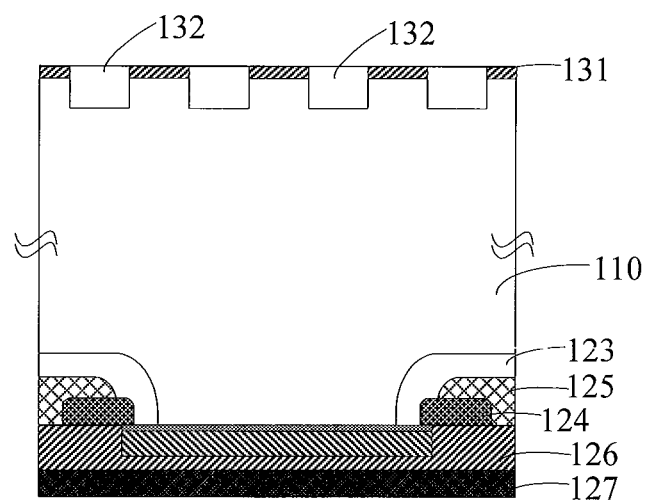

In step S122, a trench 132 is formed at the back side of the N-type substrate 110 by photoetching and etching processes. As shown in FIG. 11, in the embodiment, the trench 132 formed at the back side of the N-type substrate 110 is of a rectangle shape. Of course, the trench 132 formed at the back side of the N-type substrate 110 is of a circle, an oval, a trapezium and other appropriate shapes. When the trench 132 formed at the back side of the N-type substrate 110 is of a rectangle shape, a depth of the trench 132 is from 1 to 20 µm, a width thereof is from 1 to 30 µm, and a distance between two adjacent trenches 132 is from 50 to 300 µm.

Figure 12:
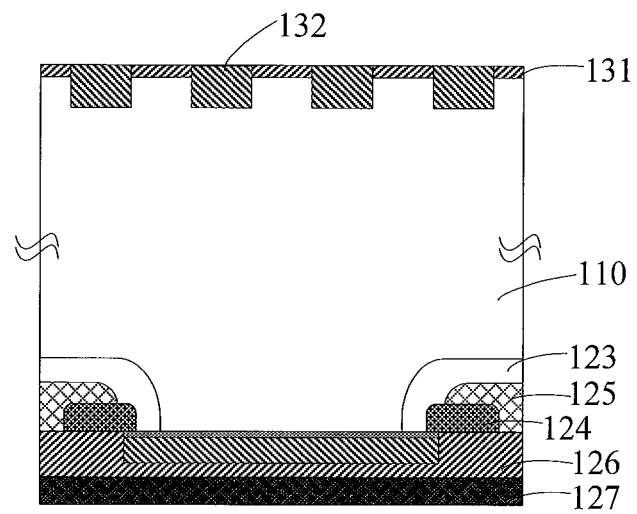

In step S123, the trench 132 is filled by depositing polysilicon at the back side of the N-type substrate 110, and the polysilicon at an area outside of the trench 132 is etched. As shown in FIG. 12, in step S123, the reverse conducting diode is formed by filling polysilicon in the trench 132. The parameters of the reverse conducting diode at the back side of the manufactured reverse conducting insulated gate bipolar transistor can be adjusted by adjusting the doping concentration of polysilicon in the trench 132, so that the difficulty of the adjusting process is low and it is easy to control the process. Therefore, the manufacturing difficulty of the reverse conducting insulated gate bipolar transistor can be reduced. Of course, the parameters of the reverse conducting diode at the back side of the reverse conducting insulated gate bipolar transistor can be also adjusted by adjusting a width and a depth of the trench 132, or by adjusting the doping concentration of polysilicon in the trench 132 and the width and the depth of the trench 132 at the same time. Therefore, the difficulty of the adjusting process of the reverse conducting insulated gate bipolar transistor can be reduced, and then the manufacturing difficulty thereof is reduced. In the embodiment, the polysilicon deposited in the trench 132 formed at the back side of the N-type substrate 110 is N-type polysilicon. The doping concentration of the polysilicon deposited in the trench 132 is 1E17 to 1E21 $cm^{-3}$.

Figure 13:
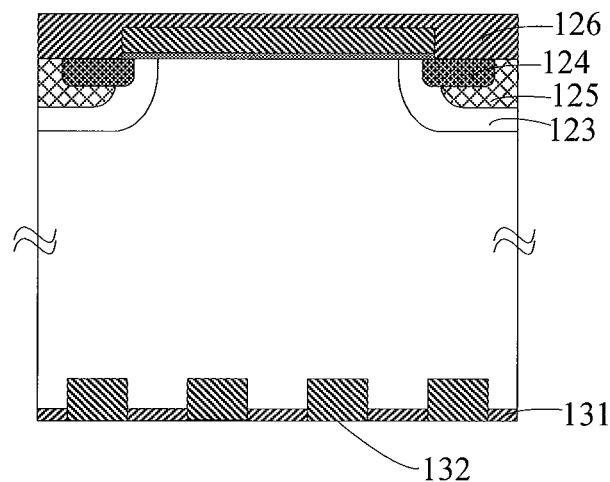

In step S124, the protecting layer 127 at the front side of the N-type substrate is removed, as shown in FIG. 13.

Figure 14:
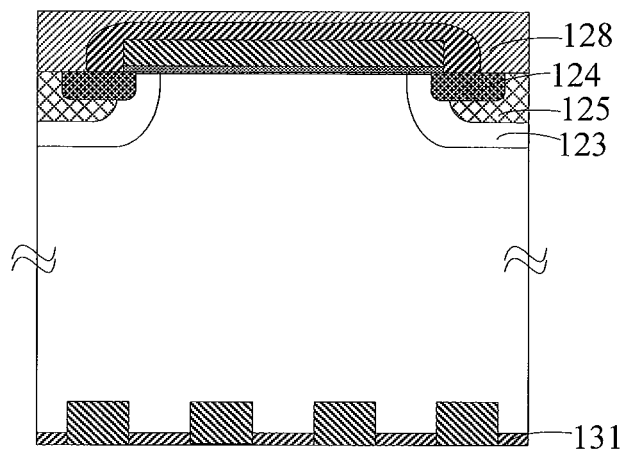

In step S125, a contact hole for shorting the N+ region 124 and the front side P+ region 125 is formed by selectively etching the dielectric layer 126, and a front side metal layer 128 is formed. As shown in FIG. 14, from the manufacturing flow of the reverse conducting insulated gate bipolar transistor described above, it can be understood that step S122 and step S123 are performed after performing step S116. In other words, forming the trench 132 at the back side of the N-type substrate 110 and depositing the polysilicon in the trench 132 are performed after performing depositing the dielectric layer 126 at the front side of the N-type substrate 110 rather than after performing the whole front side process of the reverse conducting insulated gate bipolar transistor. Such a manufacturing method has the following advantages. Firstly, after the P-type impurity is implanted at the back side of the N-type substrate 110 in step S121, the following front side thermal processes such as the hole reflow process (the hole reflow process is in forming the contact hole for shorting the N+ region 124 and the front side P+ region 125 by selectively etching the dielectric layer 126 and forming a front side metal layer 128 of step S125, and the temperature of the step S125 is about 850 degrees centigrade) and so on are performed. The activity of the P-type impurity at the back side of the N-type substrate 110 is very high without performing the annealing process individually. Therefore, the step of the thermal annealing of the P-type impurity at the back side of the N-type substrate 110 can be omitted. Further, the polysilicon in the trench 123 at the back side of the N-type substrate 110 and the polysilicon of the front side are processed separately, thus easily controlling the doping concentration of the polysilicon.

Figure 15:
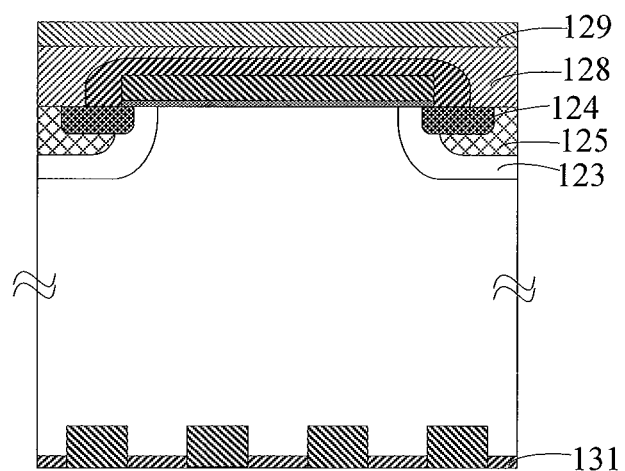
Figure 16:
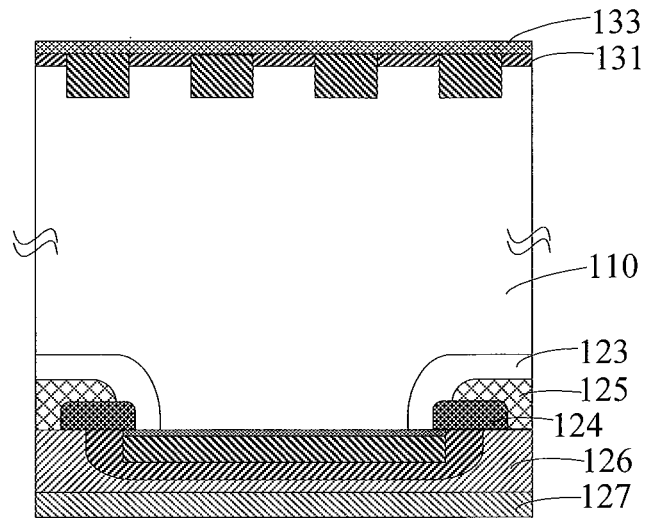

In step S126, a passivation layer 129 is deposited at the front side of the N-type substrate 110. As shown in FIG. 15, here, a pad area is formed by performing the etching process.

In step S127, a back side metal layer 133 is formed by performing a back side metalized process at the back side of the N-type substrate 110. In the embodiment, from the N-type substrate to an external, the back side metal layer 133 at the back side of the N-type substrate 110 comprises aluminum, titanium, nickel and silver, which are laminated in that order. In other words, the outermost layer is metal silver.

Figure 17:
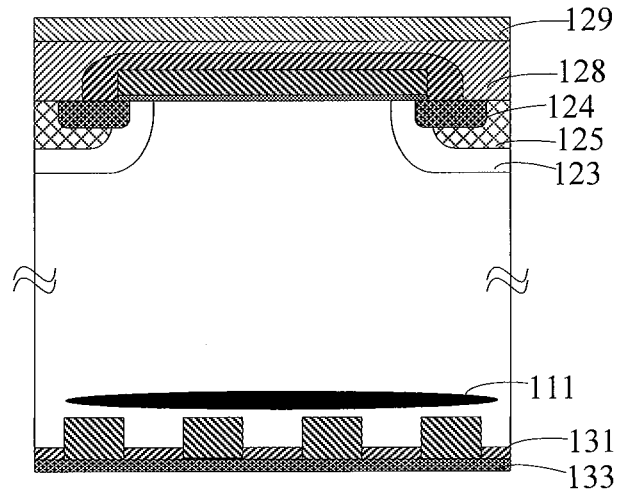

In step S128, a carrier lifetime at a partial area 111 in the N-type substrate 110 is controlled by a local radiation technique. As shown in FIG. 17, in the embodiment, the local radiation technique radiates the N-type substrate 110 by using electron or proton to control the life of the carrier at a partial area 111 in the N-type substrate 110. Therefore, manufacturing of the reverse conducting insulated gate bipolar transistor is completed.

The method of manufacturing the reverse conducting insulated gate bipolar transistor described above uses polysilicon for filling the trench at the back side of the reverse conducting insulated gate bipolar transistor. Thus, the parameters of the reverse conducting diode at the back side of the reverse conducting insulated gate bipolar transistor can be controlled by only precisely controlling the doping concentration of polysilicon, resulting in a lower requirement of controlling the process. Therefore, the method of manufacturing the reverse conducting insulated gate bipolar transistor has a lower requirement of controlling the manufacturing process, and a less difficulty of manufacturing.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A method of manufacturing a reverse conducting insulated gate bipolar transistor, comprising the following steps:
    preparing an N-type substrate;
    growing a gate oxide layer at a front side of the N-type substrate;
    depositing a polysilicon gate on the gate oxide layer;
    forming a P well on the N-type substrate by photoetching, etching and ion-implanting processes;
    forming an N+ region and a front side P+ region in the P well by photoetching and ion-implanting processes;
    depositing a dielectric layer at the front side of the N-type substrate;
    depositing a protecting layer on the dielectric layer;
    grinding the N-type substrate by a back side grinding process;
    forming a back side P+ region by implanting a P-type impurity to a back side of the N-type substrate;
    forming a trench at the back side of the N-type substrate by photoetching and etching processes;
    filling the trench by depositing polysilicon at the back side of the N-type substrate, and etching the polysilicon positioned at an area outside of the trench;
    removing the protecting layer at the front side of the N-type substrate;
    selectively etching the dielectric layer to form a contact hole for shorting the N+ region and the front side P+ region, and forming a front side metal layer;
    depositing a passivation layer at the front side of the N-type substrate; and
    performing a back side metallization process at the back side of the N-type substrate, and forming a back side metal layer.

2. The method of manufacturing the reverse conducting insulated gate bipolar transistor of claim 1, characterized in that, after forming the back side metal layer by performing the back side metalized process at the back side of the N-type substrate, the method further comprises controlling a carrier lifetime at a partial area in the N-type substrate by a local radiation technique.

3. The method of manufacturing the reverse conducting insulated gate bipolar transistor of claim 2, characterized in that, the local radiation technique radiates the N-type substrate by using electron or proton.

4. The method of manufacturing the reverse conducting insulated gate bipolar transistor of claim 1, characterized in that, the trench formed at the back side of the N-type substrate is of a rectangle shape.

5. The method of manufacturing the reverse conducting insulated gate bipolar transistor of claim 4, characterized in that, a depth of the trench formed at the back side of the N-type substrate is from 1 to 20 μm, a width thereof is from 1 to 30 μm, and a distance between two adjacent trenches is from 50 to 300 μm.

6. The method of manufacturing the reverse conducting insulated gate bipolar transistor of claim 1, characterized in that, the polysilicon deposited in the trench formed at the back side of the N-type substrate is N-type polysilicon.

7. The method of manufacturing the reverse conducting insulated gate bipolar transistor of claim 6, characterized in that, a doping concentration of the polysilicon deposited in the trench formed at the back side of the N-type substrate is 1E17 to 1E21 $cm^{-3}$.

8. The method of manufacturing the reverse conducting insulated gate bipolar transistor of claim 1, characterized in that, from the N-type substrate to an external, the back side metal layer comprises aluminum, titanium, nickel and silver, which are laminated in that order.

9. The method of manufacturing the reverse conducting insulated gate bipolar transistor of claim 1, characterized in that, the dielectric layer is made of silicon dioxide and boro-phospho-silicate glass.

10. The method of manufacturing the reverse conducting insulated gate bipolar transistor of claim 1, characterized in that, the protecting layer is made of silicon nitride.

* * * * *